(12) United States Patent
Lee et al.

(10) Patent No.: US 10,396,030 B2
(45) Date of Patent: Aug. 27, 2019

(54) SEMICONDUCTOR DEVICE, LAYOUT DESIGN METHOD FOR THE SAME AND METHOD FOR FABRICATING THE SAME

(71) Applicant: SAMSUNG ELECTRONICS CO., LTD., Suwon-si, Gyeonngi-Do (KR)

(72) Inventors: Joon-Nyung Lee, Seoul (KR); Jeong Hoon Ahn, Yongin-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/015,465

(22) Filed: Jun. 22, 2018

(65) Prior Publication Data
US 2019/0157198 A1 May 23, 2019

(30) Foreign Application Priority Data

Nov. 21, 2017 (KR) ........................ 10-2017-0155586

(51) Int. Cl.
*H01L 23/522* (2006.01)
*H01L 23/528* (2006.01)
*H01L 21/768* (2006.01)
*H01L 49/02* (2006.01)

(52) U.S. Cl.
CPC ...... *H01L 23/528* (2013.01); *H01L 21/76802* (2013.01); *H01L 21/76877* (2013.01); *H01L 23/5222* (2013.01); *H01L 23/5223* (2013.01); *H01L 23/5226* (2013.01); *H01L 23/5283* (2013.01); *H01L 28/90* (2013.01); *H01L 28/92* (2013.01); *H01L 28/40* (2013.01); *H01L 28/82* (2013.01)

(58) Field of Classification Search
None
See application file for complete search history.

(56) References Cited

U.S. PATENT DOCUMENTS

| | | | |
|---|---|---|---|
| 6,385,033 B1 * | 5/2002 | Javanifard | H01L 27/0805 257/528 |
| 8,330,251 B2 | 12/2012 | Chang et al. | |
| 8,775,977 B2 | 7/2014 | Hsu et al. | |
| 8,881,083 B1 | 11/2014 | Deng et al. | |
| 8,918,745 B2 | 12/2014 | Wang et al. | |
| 9,026,973 B2 | 5/2015 | Tien et al. | |
| 9,041,155 B2 | 5/2015 | Cheng et al. | |
| 9,098,670 B2 | 8/2015 | Song et al. | |
| 9,159,718 B2 | 10/2015 | Yen et al. | |
| 9,355,204 B2 | 5/2016 | Seo et al. | |
| 9,576,735 B2 | 2/2017 | Augur et al. | |
| 2006/0006496 A1 * | 1/2006 | Harris | H01L 23/5223 257/532 |
| 2013/0001746 A1 * | 1/2013 | Edwards | H01L 28/82 257/534 |
| 2013/0200489 A1 * | 8/2013 | Huang | H01L 23/5223 257/532 |

(Continued)

*Primary Examiner* — Minh Loan Tran
(74) *Attorney, Agent, or Firm* — F. Chau & Associates, LLC

(57) ABSTRACT

A semiconductor device includes a first electrode which includes a first main portion, and a first extension that extends from the first main portion, and a dielectric layer which surrounds a sidewall and a bottom surface of the first main portion, wherein the first main portion includes a first portion having a first depth, and a second portion having a second depth deeper than the first depth.

20 Claims, 13 Drawing Sheets

(56) References Cited

U.S. PATENT DOCUMENTS

2015/0089457 A1 3/2015 Agarwal et al.
2016/0125117 A1 5/2016 Kim et al.
2017/0147740 A1 5/2017 Chang

* cited by examiner

SEMICONDUCTOR DEVICE, LAYOUT DESIGN METHOD FOR THE SAME AND METHOD FOR FABRICATING THE SAME

CROSS-REFERENCE TO RELATED APPLICATIONS

This application claims priority under 35 U.S.C. 119 to Korean Patent Application No. 10-2017-0155586 filed on Nov. 21, 2017 in the Korean Intellectual Property Office, the disclosure of which is incorporated by reference in its entirety herein.

BACKGROUND

1. Technical Field

The present inventive concept relates to a semiconductor device, a layout design method of the semiconductor device, and a method for fabricating the semiconductor device. More specifically, the present inventive concept relates to a semiconductor device including a capacitor structure, a layout design method of the semiconductor device, and a method for fabricating the semiconductor device.

2. Discussion of Related Art

The fabrication of an integrated circuit (IC) requires a variety of processes performed on a semiconductor substrate. The processes include steps of wafer production and building of circuits on the wafer board (patterning). The widths of patterns generated from the patterning can be reduced to create a semiconductor device with high integration. Multi-patterning is a class of technologies for manufacturing ICs with an enhanced density. However, the reliability of semiconductor devices generated from multi-patterning may be degraded when the widths of the patterns are reduced too greatly.

SUMMARY

At least one embodiment of the present inventive concept provides a semiconductor device with improved product reliability.

At least one embodiment of the present inventive concept provides method of designing a layout (e.g., a circuit layout) of a semiconductor device with improved color balance.

At least one embodiment of the present inventive concept provides a method for fabricating a semiconductor device with improved product reliability.

According to an exemplary embodiment of the present inventive concept, there is provided a semiconductor device having a first electrode which including a first main portion, and a first extension that extends from the first main portion, and a dielectric layer which surrounds a sidewall and a bottom surface of the first main portion, wherein the first main portion includes a first portion having a first depth, and a second portion having a second depth deeper than the first depth.

According to an exemplary embodiment of the present inventive concept, there is provided a semiconductor device having a first electrode which includes a first main portion extending in a first direction, and a first extension extending from the first main portion in a second direction intersecting with the first direction, a second electrode which includes a second extension extending in the second direction, and a dielectric layer which surrounds a sidewall and a bottom surface of the first main portion, wherein the first main portion includes a first portion having a first depth, and the second extension has a second depth shallower than the first depth.

According to an exemplary embodiment of the present inventive concept, there is provided a semiconductor device having a first electrode which includes a first main portion extending in a first direction, and a plurality of first extensions extending from the first main portion in a second direction intersecting with the first direction, a second electrode which includes a plurality of second extensions extending in the second direction, and a dielectric layer between each of the first extensions and each of the second extensions, wherein each of the first extensions and each of the second extensions are arranged alternately along the first direction, the first main portion includes a plurality of first portions having a first depth, and a plurality of second portions having a second depth deeper than the first depth, and each of the second portions of the first main portion overlaps each of the second extensions in the second direction.

According to an exemplary embodiment of the present inventive concept, there is provided a method for manufacturing a semiconductor device. The method includes loading a circuit layout having a first layout pattern including a first main region extending in a first direction, and a plurality of first extension regions extending from the first main region in a second direction intersecting with the first direction, and modifying the circuit layout by separating the first layout pattern to generate a first color pattern and a second color pattern, wherein the first color pattern includes a first sub-extension region which is one of the plurality of first extension regions, and a first sub-main region which is a part of the first main region connected to the first sub-extension region, and the second color pattern includes a second sub-extension region adjacent to the first sub-extension region, and a second sub-main region which is a part of the first extension region connected to the second sub-extension region.

According to an exemplary embodiment of the present inventive concept, there is provided a method for manufacturing a semiconductor device. The method includes loading a first circuit layout having a first layout pattern including a plurality of adjacent first portions, modifying the first circuit layout so that a first set of the first portions have a first color, a second set of the first portions have a second color. The first set alternates with the second set. Each of the first portions include a first main part and a first extension that extends from the first main part.

BRIEF DESCRIPTION OF THE DRAWINGS

The present inventive concept will become more apparent by describing in detail exemplary embodiments thereof with reference to the attached drawings, in which.

DETAILED DESCRIPTION OF THE EXEMPLARY EMBODIMENTS

The present inventive concept and methods of accomplishing the same may be understood more readily by reference to the following detailed description of the exemplary embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the invention to those skilled in the art.

Hereinafter, a semiconductor device according to an exemplary embodiment of the present inventive concept will be described with reference to FIGS. 1 to 9.

Figure 1:
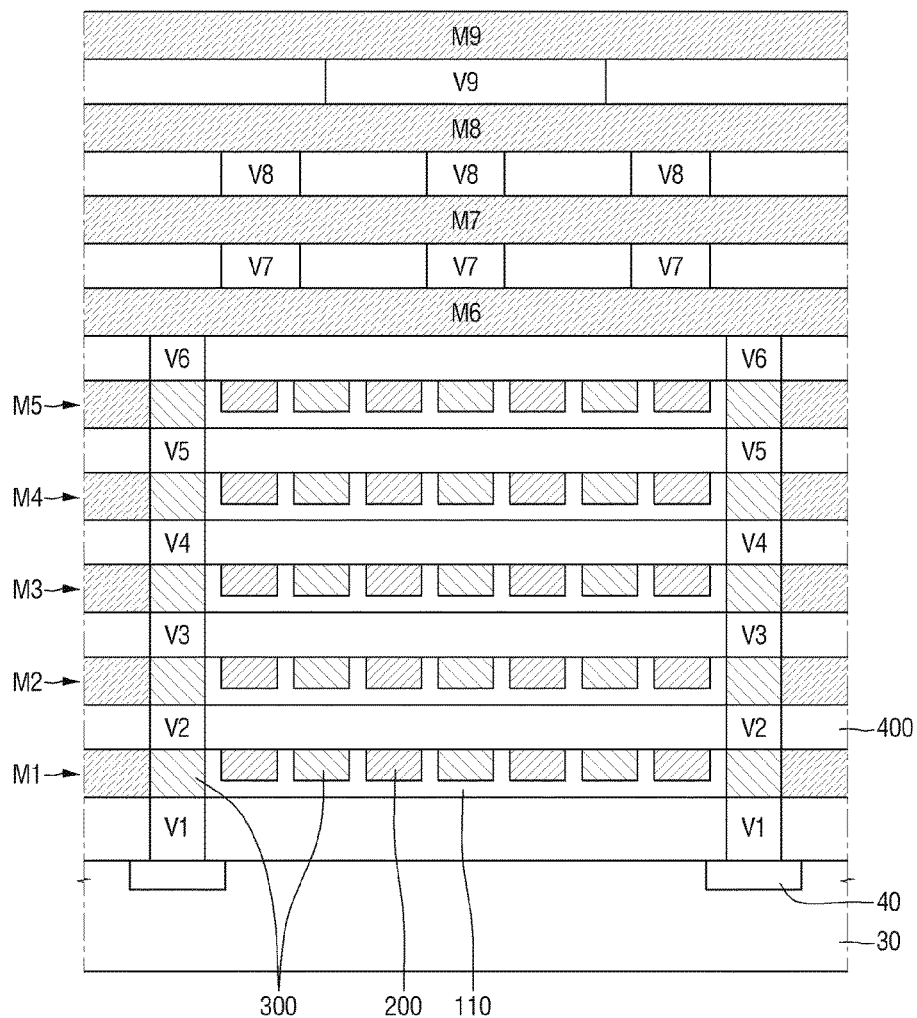
FIG. 1 is a schematic cross-sectional view for explaining a semiconductor device according to an exemplary embodiment of the present inventive concept.

FIG. 1 is a schematic cross-sectional view for explaining a semiconductor device according to an exemplary embodiment of the present inventive concept.

Referring to FIG. 1, a semiconductor device according to an exemplary embodiment includes a substrate 30, an impurity region 40, a plurality of wiring layers (M1 to M9), a plurality of interlayer insulating layers 400, and a plurality of via layers (V1 to V9).

The substrate 30 may be, for example, bulk silicon or a silicon-on-insulator (SOI). The substrate 30 may be a silicon substrate or may contain other materials such as silicon germanium, indium antimonide, lead tellurium compounds, indium arsenide, indium phosphide, gallium arsenide or gallium antimonide. In an embodiment, the substrate 30 has an epitaxial layer formed on a base substrate.

The impurity region 40 is formed in the substrate 30. For example, a p-type impurity or an n-type impurity is injected into the substrate 30, so that the impurity region 40 may be formed. However, embodiments of the present inventive concept are not limited thereto. For example, the impurity region 40 may be a region epitaxially grown from the substrate 30.

The wiring layers (M1 to M9) and the interlayer insulating layers 400 are alternately stacked on the substrate 30. Further, the via layers (V1 to V9) are disposed in each interlayer insulating layer 400 between the wiring layers (M1 to M9). The wiring layers (M1 to M9) are electrically connected to each other by the via layers (V1 to V9).

The numbers of the wiring layers (M1 to M9), the interlayer insulating layers 400 and the via layers (V1 to V9) are illustrated as nine, respectively, but this is only for convenience of explanation. Also, the number of each of the via layers (V1 to V9) in each interlayer insulating layer 400 is illustrated as one to three, respectively, but this is only for convenience of explanation.

In an exemplary embodiment, a contact pad is connected to an uppermost wiring layer M9. The contact pad may be made of a conductive material.

In an embodiment, a part of at least one of the wiring layers (M1 to M9) includes a dielectric layer 110, a first electrode 200, and a second electrode 300, respectively. In FIG. 1, only five layers (M1 to M9) are illustrated as including the dielectric layer 110, the first electrode 200 and the second electrode 300, respectively. However, this is only for convenience of description, and embodiments of the present inventive concept are not limited thereto. For example, four or less or six or more wiring layers (M1 to M9) may include the dielectric layer 110, the first electrode 200, and the second electrode 300, respectively.

Hereinafter, the dielectric layer 110, the first electrode 200, and the second electrode 300 will be more specifically described with reference to FIGS. 2 to 5.

Figure 2:
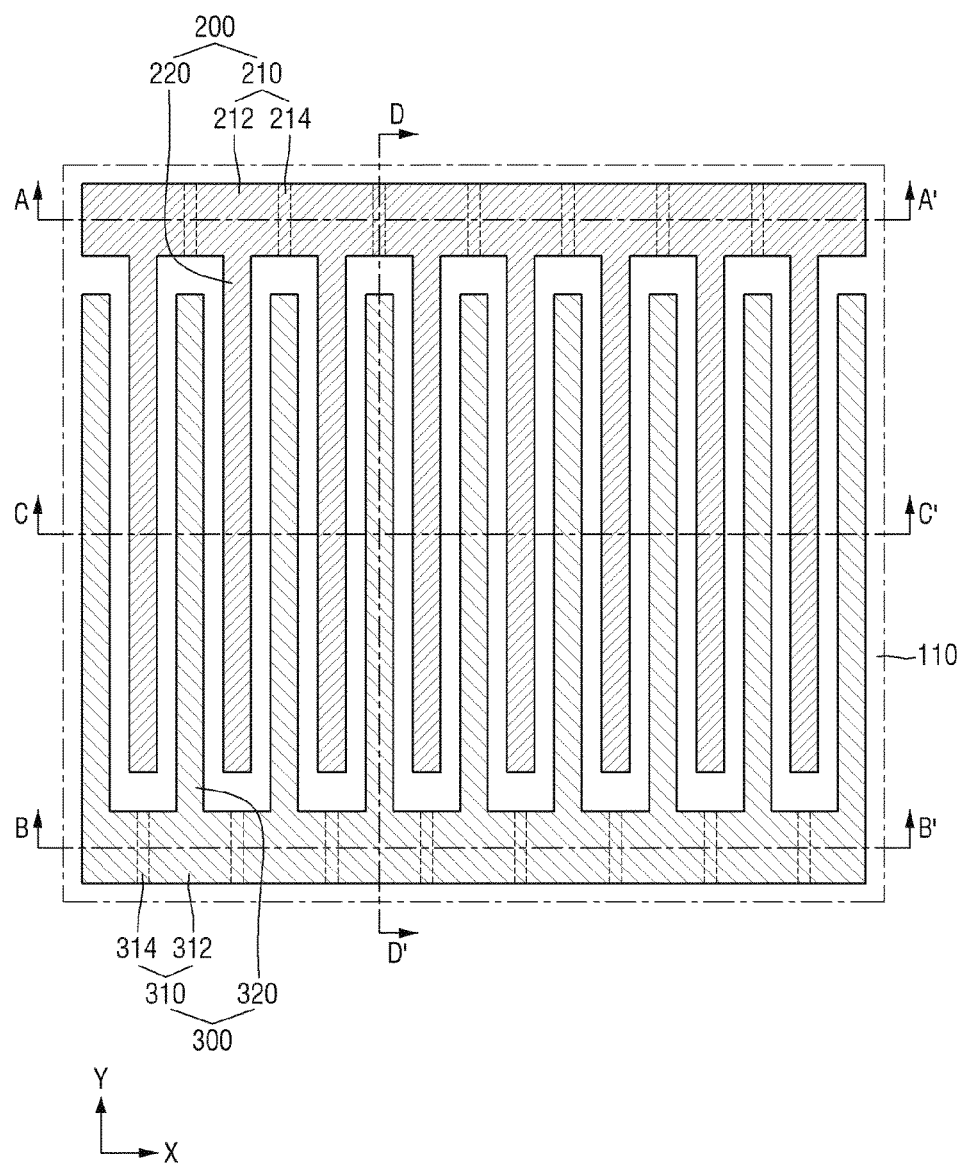
FIG. 2 is a plan view for explaining one of the wiring layers of FIG. 1.
Figure 3:
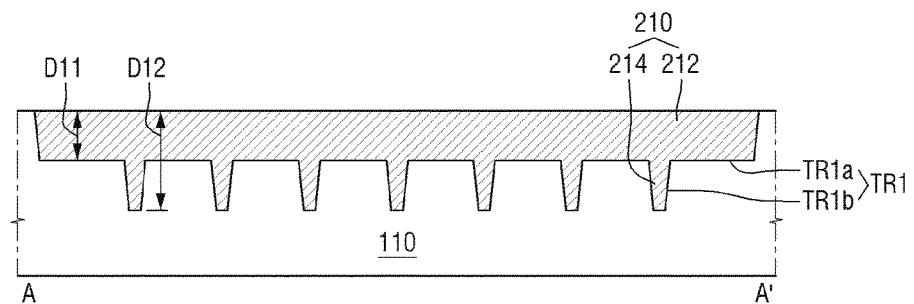
FIG. 3 is a cross-sectional view taken along line A-A' and line B-B' of FIG. 2.
Figure 3:
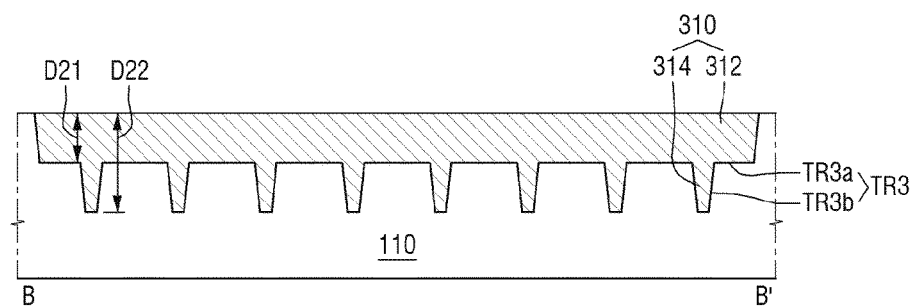
Figure 4:
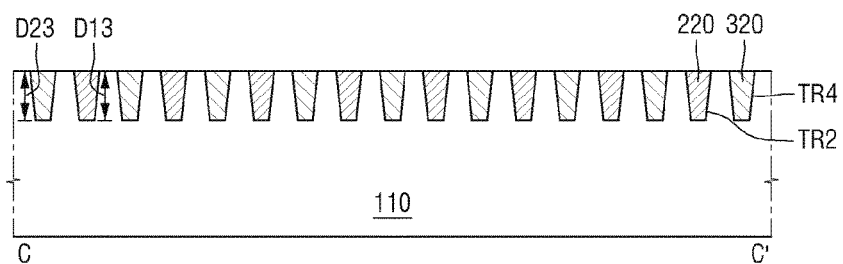
FIG. 4 is a cross-sectional view taken along the line C-C' of FIG. 2.
Figure 5:
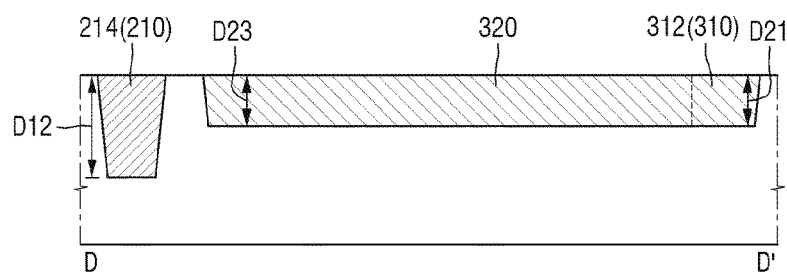
FIG. 5 is a cross-sectional view taken along the line D-D' of FIG. 2.

FIG. 2 is a plan view for explaining one of the wiring layers of FIG. 1. FIG. 3 is a cross-sectional view taken along line A-A' and line B-B' of FIG. 2. FIG. 4 is a cross-sectional view taken along the line C-C' of FIG. 2. FIG. 5 is a cross-sectional view taken along the line D-D' of FIG. 2. For the sake of convenience of explanation, the repeated parts of those described with reference to FIG. 1 will be briefly explained or omitted.

Referring to FIGS. 2 to 5, a semiconductor device according to an exemplary embodiment of the present inventive concept includes the dielectric layer 110, the first electrode 200, and the second electrode 300.

The dielectric layer 110 includes an insulating material. For example, the dielectric layer 110 may include at least one of silicon oxide, silicon nitride, silicon oxynitride, or combinations thereof.

In an embodiment, the dielectric layer 110 includes a first trench TR1, a second trench TR2, a third trench TR3, and a fourth trench TR4. The first trench TR1, the second trench TR2, the third trench TR3, and the fourth trench TR4 of the dielectric layer 110 may be formed, for example, by etching a part of the dielectric layer 110 through a photolithography process. In an embodiment, the dielectric layer 110 includes several second trenches TR2 and several fourth trenches TR4 that alternate with the second trenches TR2.

The first electrode 200 is formed on the dielectric layer 110. In an embodiment, the first electrode 200 includes a first strap 210 (e.g., a first main portion) and a first finger 220 (e.g., a first extension). In an embodiment, the first electrode 200 includes multiple first fingers 220 (e.g., multiple first extensions).

The first strap 210 of the first electrode 200 extends in a first direction X. For example, the first strap 210 may fill the first trench TR1 of the dielectric layer 110 extending in the first direction X.

The first finger 220 of the first electrode 200 diverges from the first strap 210. That is, the first finger 220 extends from the first strap 210 in a second direction Y intersecting with the first direction X. For example, the first finger 220 fills the second trench TR2 of the dielectric layer 110 extending in the second direction Y. For example, when there are multiple second trenches TR2 as shown in FIG. 4, the first fingers 220 fill all of the second trenches TR2. The first direction X and the second direction Y may be, for example, orthogonal to each other, but embodiments of the present inventive concept are not limited thereto. Also, the plurality of first fingers 220 diverge (e.g., extend) from the first strap 210. The plurality of first fingers 220 may extend in parallel to each other.

The first electrode 200 may include, for example, a metal material. For example, the first electrode 200 may include a metal material such as copper (Cu), tungsten (W), aluminum (Al), silver (Ag), gold (Au), or an alloy thereof.

The second electrode 300 is formed on the dielectric layer 110. In an embodiment, the second electrode 300 includes a second strap 310 (e.g., a second main portion) and a second finger 320 (e.g., second extension). In an embodiment, the second electrode 300 includes multiple second fingers 320 (e.g., second extensions).

The second strap 310 of the second electrode 300 may extend in the first direction X. For example, the second strap 310 may fill the third trench TR3 of the dielectric layer 110 extending in the first direction X.

The second finger 320 of the second electrode 300 diverges from the second strap 310. That is, the second finger 320 may extend in the second direction Y. For example, the second finger 320 may fill the fourth trench TR4 of the dielectric layer 110 extending in the second direction Y. For example, when there are multiple fourth trenches TR4 as shown in FIG. 4, the second fingers 320 fill all of the fourth trenches TR4. In an embodiment, the plurality of second fingers 320 diverge (e.g., extend) from the second strap 310. The plurality of second fingers 320 may extend in parallel to each other.

The second electrode 300 may include, for example, a metal material. For example, the second electrode 300 may include a metal material such as copper (Cu), tungsten (W), aluminum (Al), silver (Ag), gold (Au), or an alloy thereof.

In an embodiment, the plurality of first fingers 220 and the plurality of second fingers 320 are alternately arranged. For example, as illustrated in FIG. 2, the first finger 220 and the second finger 320 may be arranged alternately along the first direction X. In an embodiment, the dielectric layer 110 is interposed between the first finger 220 and the second finger 320 to electrically insulate the first finger 220 from the second finger 320.

The semiconductor device according to at least one embodiment of the inventive concept includes a capacitor. For example, the first electrode 200 may be connected to a high power supply line (e.g., VDD), and the second electrode 300 may be connected to a low power supply line (e.g., VSS). In an embodiment, charges are stored in the dielectric layer 110 by a potential difference generated between the first electrode 200 and the second electrode 300. For example, the first electrode 200 could be a first plate of a capacitor and the second electrode 300 could be a second other plate of the capacitor.

In an embodiment, a bottom surface of the first strap 210 is uneven. For example, as illustrated in FIGS. 2 and 3, the first strap 210 includes a plurality of first portions 212 and a plurality of second portions 214 having different depths. For example, the first portions 212 may alternate with the second portions 214.

For example, the first trench TR1 of the dielectric layer 110 may have an uneven surface. For example, the first trench TR1 may include a plurality of first sub-trenches TR1a having a first depth D11, and a plurality of second sub-trenches TR1b having a second depth D12. In an exemplary embodiment, the second depth D12 is deeper than the first depth D11. In an embodiment, the bottom surface of each second sub-trench TR1b is lower than the bottom surface of the first sub-trench TR1a. In an embodiment, the bottom surface of each second sub-trench TR1b is higher than the bottom surface of the dielectric layer 110.

In the embodiment shown in FIG. 3, the first portion 212 of the first strap 210 fills the first sub-trench TR1a, and the second portion 214 of the first strap 210 fills the second sub-trench TR1b. Therefore, the first strap 210 may include a plurality of first portions 212 having a first depth D11, and a plurality of second portions 214 having a second depth D12 that is deeper than the first depth D11.

The first portion 212 of the first strap 210 and the second portion 214 of the first strap 210 may be arranged alternately along the first direction X. In an embodiment, as illustrated in FIGS. 2 and 5, each of the second portions 214 of the first strap 210 overlap each of the second fingers 320 in the second direction Y.

In an embodiment, each of the first portions 212 of the first strap 210 overlap each of the first fingers 220 in the second direction Y. That is, the first portion 212 of the first strap 210 may be connected to the first finger 220. In an embodiment, each first finger 220 is connected to a first portion 212 of the first straps 210 to form a "T" shape or a part thereof.

The second portion 214 of the first strap 210 may have a shape extending in the second direction Y. In an embodiment where the bottom surface of the second sub-trench TR1b is higher than the bottom surface of the dielectric layer 110, the bottom surface of the second portion 214 of the first strap 210 does not extend to the bottom surface of the dielectric layer 110. That is, the dielectric layer 110 may surround the sidewall and the bottom surface of the first strap 210.

However, in an exemplary embodiment, the bottom surface of the second portion 214 of the first strap 210 extends to the bottom surface of the dielectric layer 110. In this embodiment, the second portion 214 of the first strap 210 functions as one or more of the via layers (V1 to V9) of FIG. 1.

Similar to the first strap 210, the bottom surface of the second strap 310 may also be uneven. For example, as illustrated in FIGS. 2 and 3, the second strap 310 may include a third portion 312 and a fourth portion 314 having different depths from each other.

For example, the third trench TR3 of the dielectric layer 110 may have an uneven surface. For example, the third trench TR3 may include a third sub-trench TR3a of a third depth D21, and a fourth sub-trench TR3b of a fourth depth D22. In an embodiment, the fourth depth D22 is deeper than the third depth D21. In an embodiment, the bottom surface of the fourth sub-trench TR3b is lower than the bottom surface of the third sub-trench TR3a. In an embodiment, the bottom surface of the fourth sub-trench TR3b is higher than the bottom surface of the dielectric layer 110.

In the embodiment shown in FIG. 3, the third portion 312 of the second strap 310 fills the third sub-trench TR3a, and the fourth portion 314 of the second strap 310 fills the fourth sub-trench TR3b. Therefore, in an embodiment, the second strap 310 includes the third portion 312 having the third depth D21, and the fourth portion 314 having the fourth depth D22 that is deeper than the third depth D21.

The third portion 312 of the second strap 310 and the fourth portion 314 of the second strap 310 may be arranged alternately along the first direction X. In an embodiment, as illustrated in FIGS. 2 and 5, each of the third portions 312 of the second strap 310 overlaps each of the second fingers 320 in the second direction Y. That is, the third portion 312 of the second strap 310 may be connected to the second finger 320. In an embodiment, each second finger 320 is connected to a third portion 312 of the second strap 310 to form a "T" shape or a part thereof.

In an embodiment, each of the fourth portions 314 of the second strap 310 overlap each of the first fingers 220 in the second direction Y.

The fourth portion 314 of the second strap 310 may have a shape extending in the second direction Y. In an embodiment where the bottom surface of the second sub-trench TR1b is higher than the bottom surface of the dielectric layer 110, the bottom surface of the fourth portion 314 of the second strap 310 does not extend to the bottom surface of dielectric layer 110. That is, the dielectric layer 110 may surround the sidewall and the bottom surface of the second strap 310.

However, in an embodiment, the bottom surface of the fourth portion 314 of the second strap 310 extends to the bottom surface of the dielectric layer 110. In this embodiment, the fourth portion 314 of the second strap 310 functions as one or more of the via layers (V1 to V9) of FIG. 1.

In an embodiment, the depth of the first portion 212 of the first strap 210 and the depth of the third portion 312 of the second strap 310 are substantially the same. For example, in FIG. 3, the first depth D11 and the third depth D21 are substantially the same. In the present specification, the term "substantially the same" means not only completely the same but also a fine difference which may occur due to a process margin or the like.

In an embodiment, the depth of the second portion 214 of the first strap 210 is substantially the same as the depth of the fourth portion 314 of the second strap 310. For example, in FIG. 3, the second depth D12 and the fourth depth D22 are substantially the same.

In an embodiment unlike the illustrated configuration, at least one of the bottom surface of the first strap 210 or the bottom surface of the second strap 310 are not uneven. For example, in an embodiment, the bottom surface of the first strap 210 is uneven and the bottom surface of the second strap 310 is uneven. In another embodiment, the bottom surface of the first strap 210 is not uneven, and the bottom surface of the second strap 310 is uneven.

In an embodiment, the depth of the first finger 220 is substantially the same as the depth of the first portion 212 of the first strap 210. For example, in FIGS. 3 and 4, the fifth depth D13 of the first finger 220 is substantially the same as the first depth D11 of the first portion 212 of the first strap 210.

In an embodiment, the depth of the second finger 320 is substantially the same as the depth of the third portion 312 of the second strap 310. For example, in FIGS. 3 and 4, the sixth depth D23 of the second finger 320 is substantially the same as the third depth D21 of the third portion 312 of the second strap 310.

Also, in an embodiment, the depth of the first finger 220 is substantially the same as the depth of the second finger 320. For example, in FIG. 4, the fifth depth D13 of the first finger 220 is substantially the same as the sixth depth D23 of the second finger 320. In an embodiment, the fifth depth D13 of the first finger 220 is shallower than the second depth D12 of a second portion 214.

Figure 6:
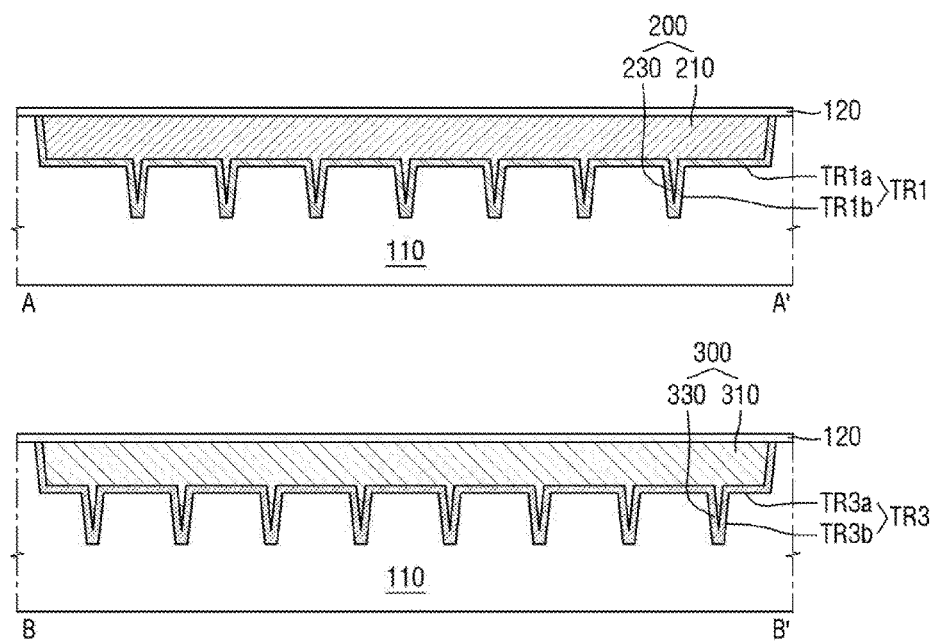
FIG. 6 is a cross-sectional view of a semiconductor device according to an exemplary embodiment of the present inventive concept.

FIG. 6 is a cross-sectional view of a semiconductor device according to an exemplary embodiment of the present inventive concept. For the sake of convenience of explanation, repeated parts of those described with reference to FIGS. 1 to 5 will be briefly explained or omitted. For reference, FIG. 6 is a cross-sectional view taken along lines A-A' and B-B' of FIG. 2.

Referring to FIGS. 2 and 6, the first electrode 200 further includes a first conductive barrier film 230, and the second electrode 300 further includes a second conductive barrier film 330.

The first conductive barrier film 230 of the first electrode 200 may extend along the profile of the first trench TR1. For example, the first conductive barrier film 230 may extend along the profile of the first sub-trench TR1a and the profile of the second sub-trench TR1b. As a result, the bottom surface of the first conductive barrier film 230 may be uneven.

The second conductive barrier film 330 of the second electrode 300 may extend along the profile of the third trench TR3. For example, the second conductive barrier film 330 may extend along the profile of the third sub-trench TR3a and the profile of the fourth sub-trench TR3b. As a result, the bottom surface of the second conductive barrier film 330 may be uneven.

The first conductive barrier film 230 may prevent the first electrode 200 from diffusing into other regions. The second conductive barrier film 330 may prevent the second electrode 300 from diffusing into other regions. For example, when the first electrode 200 and the second electrode 300 contain copper (Cu), the first conductive barrier film 230 and the second conductive barrier film 330 may prevent copper (Cu) from diffusing into the dielectric layer 110.

The first conductive barrier film 230 and the second conductive barrier film 330 may include, for example, a metal nitride. For example, the first conductive barrier film 230 and the second conductive barrier film 330 may include metal nitrides such as titanium nitride (TiN), tantalum nitride (TaN), or combinations thereof.

The semiconductor device according to an exemplary embodiment of the inventive concept further includes an insulating barrier film 120.

The insulating barrier film 120 may be formed on the dielectric layer 110, the first electrode 200, and the second electrode 300. For example, the insulating barrier film 120 may be formed along the upper surface of the first electrode 200, the upper surface of the second electrode 300, and the upper surface of the dielectric layer 110.

The insulating barrier film 120 may prevent the first electrode 200 and the second electrode 300 from diffusing into other regions. For example, when the first electrode 200 and the second electrode 300 contain copper (Cu), the insulating barrier film 120 may prevent copper (Cu) from diffusing into the dielectric layer or the interlayer insulating layer.

The insulating barrier film 120 may include at least one of, for example, silicon nitride (SiN), silicon carbon nitride (SiCN), silicon carbon oxynitride (SiCON), or combinations thereof.

Figure 7:
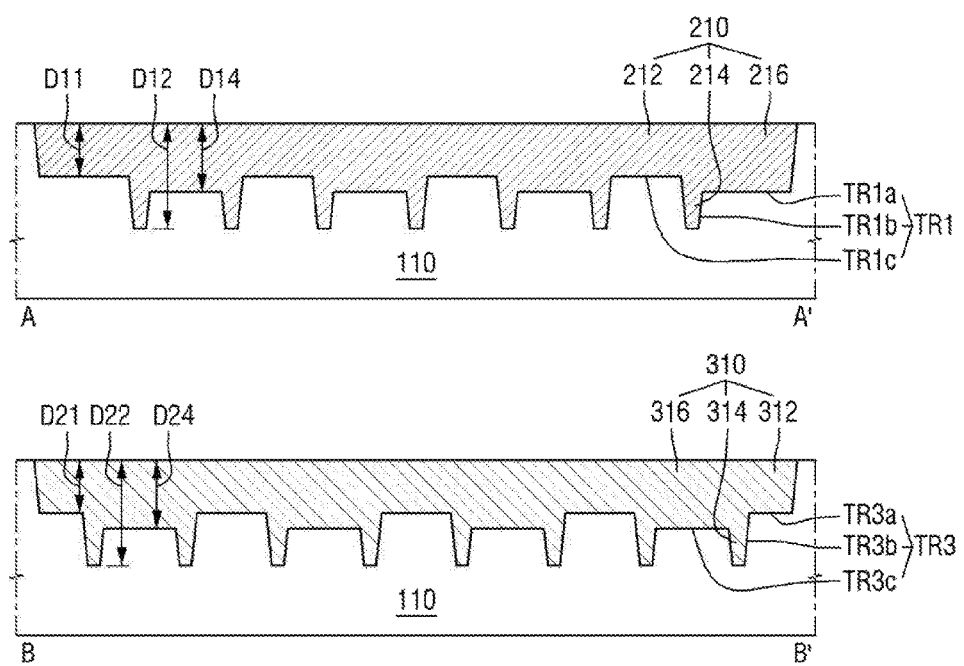
FIG. 7 is a cross-sectional view of a semiconductor device according to an exemplary embodiment of the present inventive concept.

FIG. 7 is a cross-sectional view of the semiconductor device according to an exemplary embodiment of the present inventive concept. For the sake of convenience of explanation, repeated parts of those described with reference to FIGS. 1 to 5 will be briefly explained or omitted. For reference, FIG. 7 is a cross-sectional view taken along lines A-A' and B-B' of FIG. 2.

Referring to FIG. 7, the first strap 210 (e.g., a first main portion) includes a plurality of first portions 212, a plurality of second portions 214, and a plurality of fifth portions 216. In an embodiment, the first portion 212, second portions 214, and fifth portions 216 have different depths from each other.

For example, the first trench TR1 further includes a plurality of fifth sub-trenches TR1c having a seventh depth D14. In an embodiment, the seventh depth D14 is different from the first depth D11. As illustrated in the drawings, in an embodiment, the seventh depth D14 is deeper than the first depth D11, but the present inventive concept is not limited thereto. For example, in an alternate embodiment, the seventh depth D14 is shallower than the first depth D11. In the embodiment illustrated in FIG. 7, the seventh depth D14 is shallower than the second depth D12.

In FIG. 7, the first portion 212 of the first strap 210 fills the fifth sub-trench TR1c. In an embodiment, the first strap 210 includes a plurality of first portions 212 having a first depth D11, a plurality of second portions 214 having a second depth D12 deeper than the first depth D11, and a plurality of fifth portions 216 having a seventh depth D14 different from the first depth D11.

The first portion 212, the second portion 214, and the fifth portion 216 of the first strap 210 may be arranged alternately along the first direction X. Thus, the second portion 214 of the first strap 210 may be interposed between the first portion 212 of the first strap 210 and the fifth portion 216 of the first strap 210.

In an exemplary embodiment, as illustrated in FIGS. 2 and 7, each of the second portions 214 of the first strap 210 overlap each of the second fingers 320 in the second direction Y. Also, in an exemplary embodiment, each of the first portions 212 of the first strap 210 and each of the fifth portions 216 of the first strap 210 overlap each of the first fingers 220 in the second direction Y. That is, the first portion 212 and the fifth portion 216 of the first strap 210 may be connected to the first finger 220 (e.g., a first extension).

Similar to the first strap 210, the second strap 310 may include a plurality of third portions 312, a plurality of fourth portions 314, and a plurality of sixth portions 316 having different depths from each other.

For example, the third trench TR3 further includes a plurality of sixth sub-trenches TR3c having an eighth depth D24. In an embodiment, the eighth depth D24 is different from the third depth D21. As illustrated in the drawings, the eighth depth D24 is deeper than the third depth D21, but the present inventive concept is not limited thereto. For example, in an alternate embodiment, the eighth depth D24 is shallower than the third depth D21. In the embodiment illustrated in FIG. 7, the eighth depth D24 is shallower than the fourth depth D22.

In FIG. 7, the sixth portion 316 of the second strap 310 fills the sixth sub-trench TR3c. In an embodiment, the second strap 310 includes a plurality of third portions 312 having the third depth D21, a plurality of fourth portions 314 having a fourth depth D22 deeper than the third depth D21, and a plurality of fifth portions 216 having an eighth depth D24 different from the third depth D21.

The third portion 312, the fourth portion 314, and the sixth portion 316 of the second strap 310 may be arranged alternately along the first direction X. Accordingly, the fourth portion 314 of the second strap 310 may be interposed between the third portion 312 of the second strap 310 and the sixth portion 316 of the second strap 310.

In an exemplary embodiment, as illustrated in FIGS. 2 and 7, each of the third portions 312 of the second strap 310 and each of the sixth portions 316 of the second strap 310 overlap each of the second fingers 320 in the second direction Y. That is, each of the third portions 312 of the second strap 310 and each of the sixth portions 316 of the second strap 310 may be connected to the second finger 320. In an embodiment, each of the fourth portions 314 of the second strap 310 overlap each of the first fingers 220 in the second direction Y.

Figure 8:
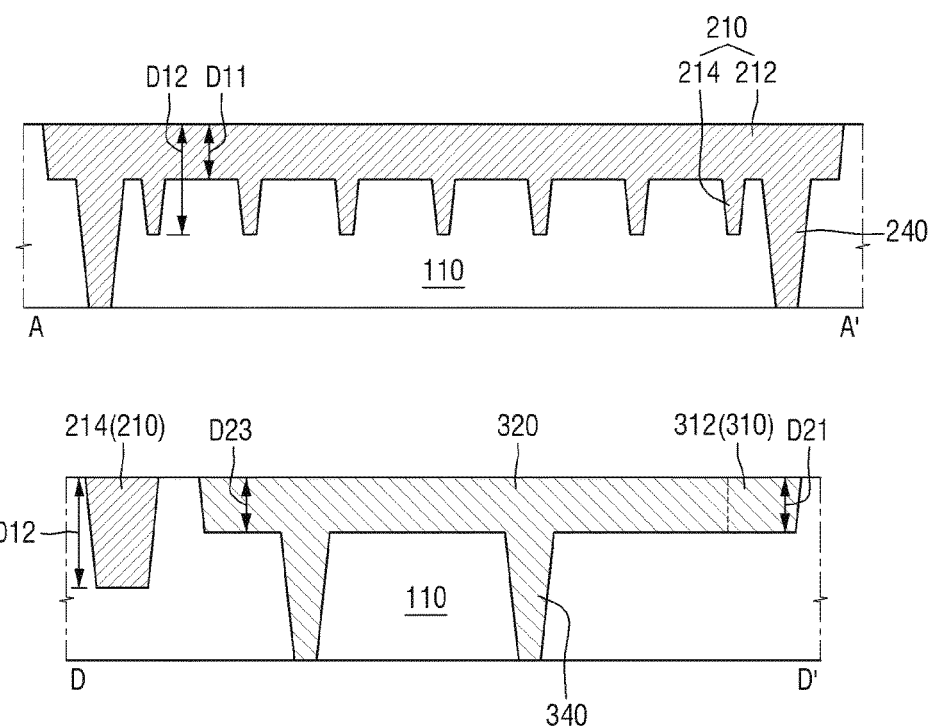
FIG. 8 is a cross-sectional view of a semiconductor device according to an exemplary embodiment of the present inventive concept.

FIG. 8 is a cross-sectional view of a semiconductor device according to an exemplary embodiment of the present inventive concept. For the sake of convenience of explanation, repeated parts of those described with reference to FIGS. 1 to 5 will be briefly explained or omitted. For reference, FIG. 8 is a cross-sectional view taken along lines A-A' and D-D' of FIG. 2.

Referring to FIG. 8, the semiconductor device according to an exemplary embodiment of the inventive concept further includes a first via 240 and a second via 340.

The first via 240 and the second via 340 may correspond to one or more of the via layers (V1 to V9) of FIG. 1. That is, the first via 240 and the second via 340 may electrically connect the wiring layers (M1 to M9) of FIG. 1.

For example, the first via 240 may extend from the bottom surface of the first strap 210 to the bottom surface of the dielectric layer 110. Therefore, the first via 240 may electrically connect the first strap 210 and other wiring layers.

For example, the second via 340 may extend from the bottom surface of the second finger 320 to the bottom surface of the dielectric layer 110. Thus, the second via 340 may electrically connect the second finger 320 and other wiring layers.

In FIG. 8, the first via 240 is illustrated as being formed at both ends of the first strap 210, but this is only for convenience of explanation since the present inventive concept is not limited thereto.

Also, in FIG. 8, two first vias 240 and two second vias 340 are illustrated, respectively, but this is only for convenience of explanation since the inventive concept is not limited thereto.

Figure 9:
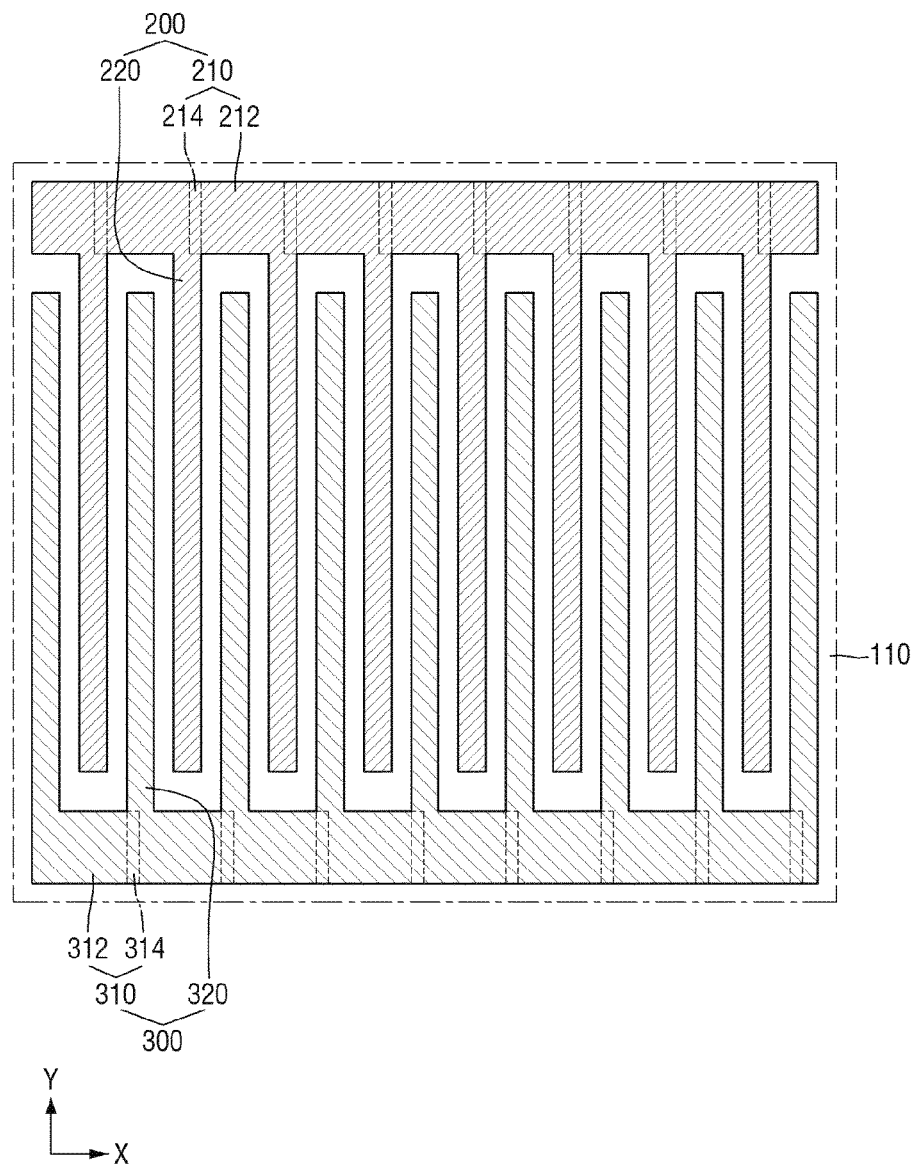
FIG. 9 is a plan view of a semiconductor device according to an exemplary embodiment of the present inventive concept.

FIG. 9 is a plan view of a semiconductor device according to an exemplary embodiment of the present inventive concept. For the sake of convenience of explanation, repeated parts of those described with reference to FIGS. 1 to 5 will be briefly explained or omitted.

Referring to FIG. 9, each of the second portions 214 of the first strap 210 overlap each of the first fingers 220 in the second direction Y. That is, the second portion 214 of the first strap 210 may be connected to the first finger 220. Also, each of the first portions 212 of the first strap 210 overlap each of the second fingers 320 in the second direction Y.

In an exemplary embodiment, each first finger 220 is connected to a first portion 212 of the first straps 210 and a second portion 212 of the first strap 210 to form an "L" shape or a part thereof.

Similar to the first strap 210, each of the fourth portions 314 of the second strap 310 overlap each of the second fingers 320 in the second direction Y. That is, the fourth portion 314 of the second strap 310 may be connected to the second finger 320. Also, each of the third portions 312 of the second strap 310 may overlap each of the first fingers 220 in the second direction Y.

In an exemplary embodiment, each second finger 320 is connected to a third portion 312 of the second strap 310 and a fourth portion 314 of the second strap 310 to form an "L" shape or a part thereof.

Hereinafter, a layout design method of a semiconductor device according to an exemplary embodiment of the present inventive concept will be described with reference to FIGS. 10 to 14.

Figure 10:
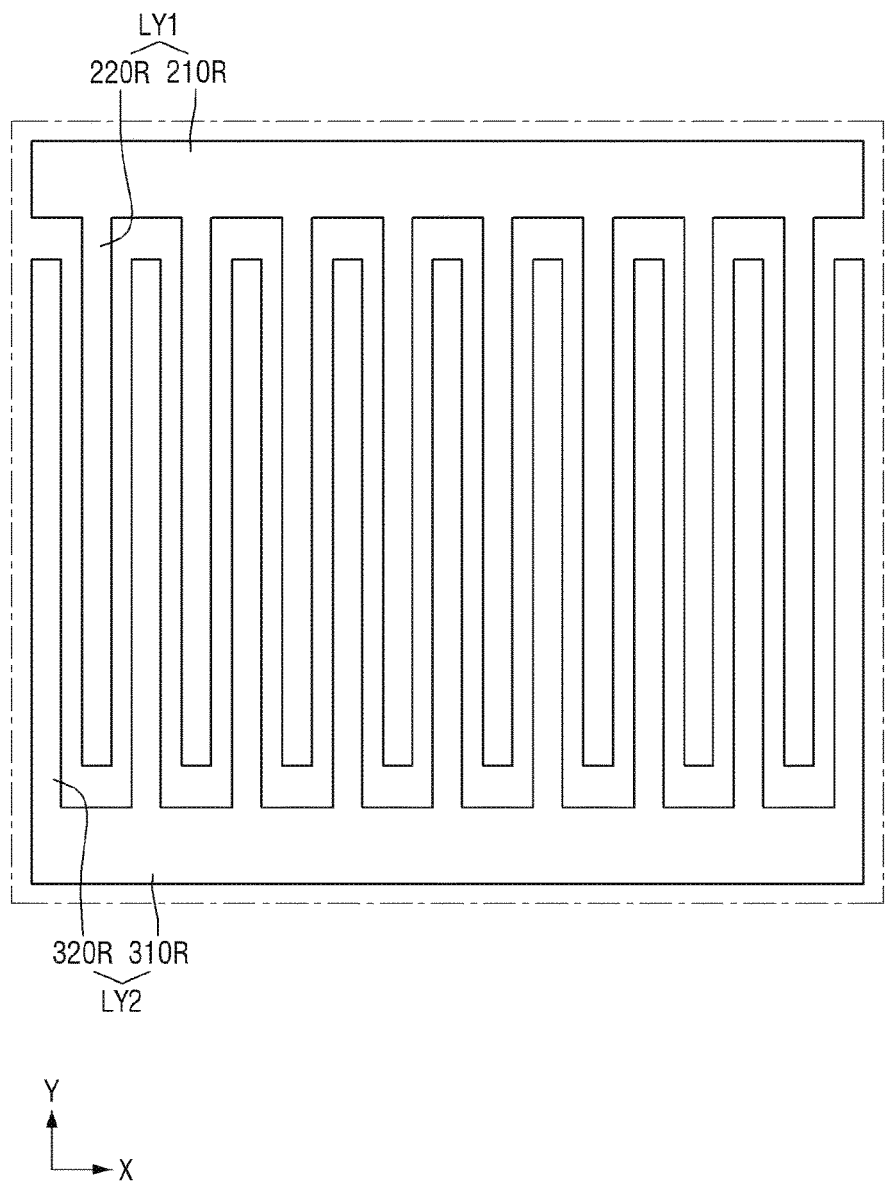
FIGS. 10 to 12 are layout diagrams for explaining a layout design method of the semiconductor device according to an exemplary embodiment of the present inventive concept.
Figure 11:
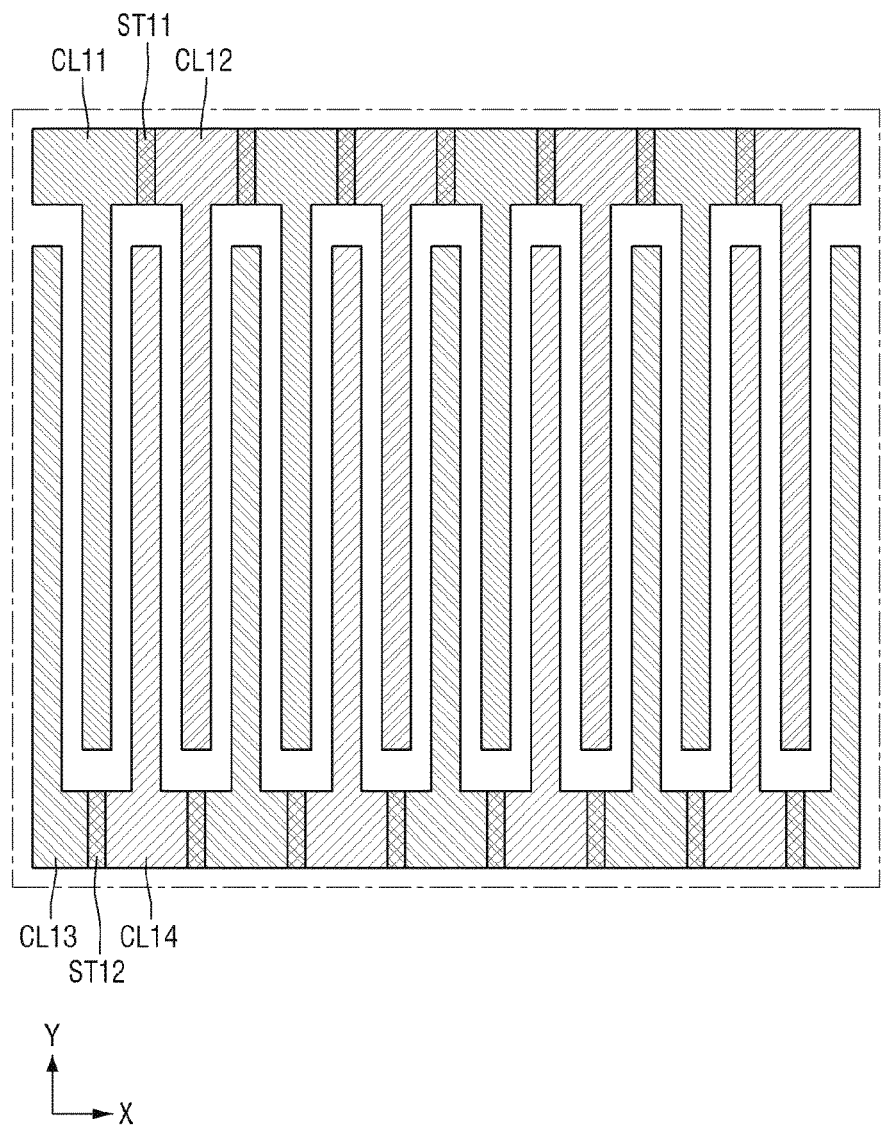
Figure 12:
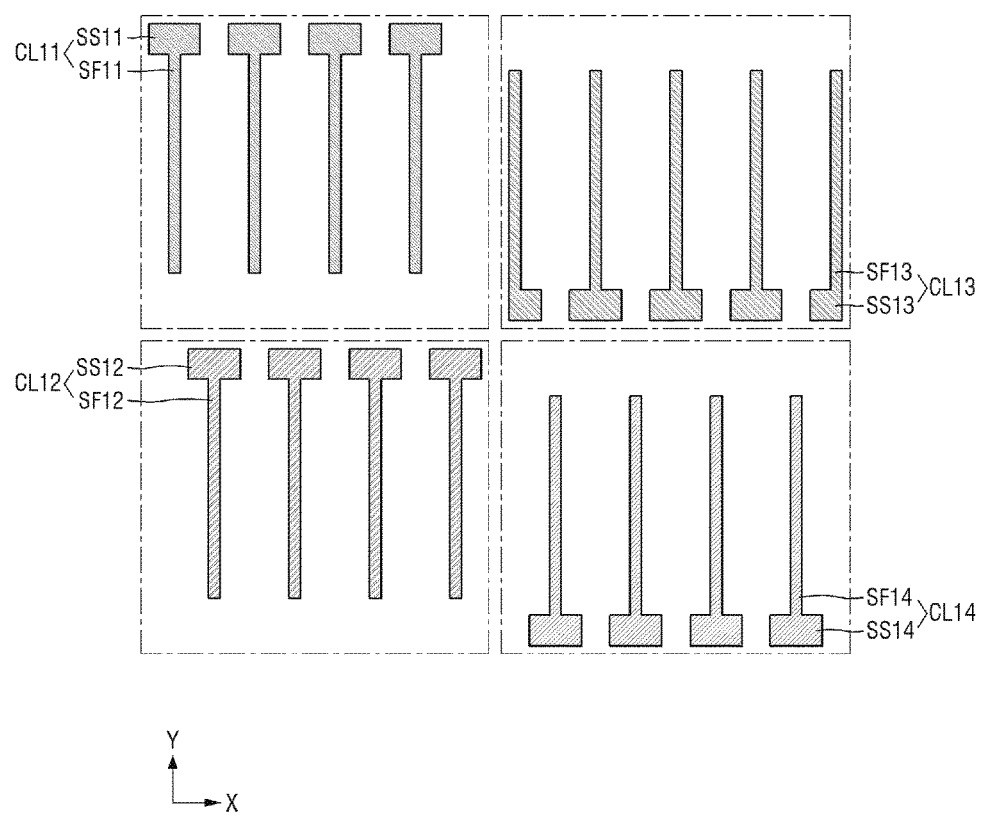

FIGS. 10 to 12 are layout diagrams for explaining a layout design method of the semiconductor device according to an exemplary embodiment of the present inventive concept.

For reference, FIG. 10 is a diagram for explaining an exemplary layout design used for fabricating a semiconductor device according to an exemplary embodiment of the present inventive concept. FIG. 12 is a layout diagram separately illustrating respective color patterns of FIG. 11.

Referring to FIG. 10, a first layout pattern LY1 and a second layout pattern LY2 are provided.

The first layout pattern LY1 includes a first strap region 210R and a first finger region 220R.

The first strap region 210R of the first layout pattern LY1 extends in the first direction X. The first finger region 220R of the first layout pattern LY1 diverges (e.g., extends) from the first strap region 210R. For example, the first finger region 220R may extend in the second direction Y. Also, the plurality of first finger regions 220R diverge (e.g., extend) from the first strap region 210R. The plurality of first finger regions 220R may extend in parallel to each other.

Similar to the first layout pattern LY1, the second layout pattern LY2 includes a second strap region 310R and a second finger region 320R.

The second strap region 310R of the second layout pattern LY2 may extend in the first direction X. The second finger region 320R of the second layout pattern LY2 diverges (e.g., extends) from the second strap region 310R. For example, the second finger region 320R may extend in the second direction Y. Also, the plurality of second finger regions 320R diverge (e.g., extend) from the second strap region 310R. The plurality of second finger regions 320R may extend in parallel to each other.

The plurality of first finger regions 220R and the plurality of second finger regions 320R may be alternately arranged. For example, as illustrated in FIG. 10, the first finger region 220R and the second finger region 320R may be arranged alternately along the first direction X.

Referring to FIGS. 10 to 12, the first layout pattern LY1 is separated to generate a first color pattern CL11 and a second color pattern CL12. In an embodiment, the color of the first color pattern CL11 is different from the color of the second color pattern CL12. Further, the second layout pattern LY2 is separated to generate a third color pattern CL13 and a fourth color pattern CL14. In an embodiment, the color of the second layout pattern LY2 is different from the color of the fourth color pattern CL14. In an embodiment, the colors of the first through fourth color patterns CL11-CL14 are all different from one another.

The first color pattern CL11 may include a plurality of first sub-finger regions SF11 and a plurality of first sub-strap regions SS11. Each first sub-finger region SF11 of the first color pattern CL11 may be one of a plurality of first finger regions (220R of FIG. 10). Each first sub-strap region SS11 of the first color pattern CL11 may be a part of a first strap region (210R of FIG. 10) connected to each of the first sub-finger regions SF11.

The second color pattern CL12 may include a plurality of second sub-finger regions SF12 and a plurality of second sub-strap regions SS12. Each second sub-finger region SF12 of the second color pattern CL12 may be a first finger region (220R of FIG. 10) adjacent to each of the first sub-finger regions SF11. Each second sub-strap region SS12 of the second color pattern CL12 may be a part of the first strap region (210R of FIG. 10) connected to each of the second sub-finger regions SF12.

The first color pattern CL11 and the second color pattern CL12 may be alternately arranged. For example, as illustrated in FIG. 11, the first color pattern CL11 and the second color pattern CL12 may be arranged alternately along the first direction X.

The third color pattern CL13 may include a plurality of third sub-finger regions SF13 and a plurality of third sub-strap regions SS13. Each of the third sub-finger regions SF13 of the third color pattern CL13 may be one of a plurality of second finger regions (320R of FIG. 10). Each of the third sub-strap regions SS13 of the third color pattern CL13 may be a part of the second strap region (310R of FIG. 10) connected to each of the third sub-finger regions SF13.

The fourth color pattern CL14 may include a plurality of fourth sub-finger regions SF14 and a plurality of fourth sub-strap regions SS14. Each fourth sub-finger region SF14 of the fourth color pattern CL14 may be a second finger region (320R of FIG. 10) adjacent to each of the third sub-finger regions SF13. Each fourth sub-strap region SS14 of the fourth color pattern CL14 may be a part of a second strap region (310R of FIG. 10) connected to each of the fourth sub-finger regions SF14.

The third color pattern CL13 and the fourth color pattern CL14 may be alternately arranged. For example, as illustrated in FIG. 11, the third color pattern CL13 and the fourth color pattern CL14 may be arranged alternately along the first direction X.

As illustrated in the drawings, each of the first color pattern CL11, the second color pattern CL12, the third color pattern CL13, and the fourth color pattern CL14 may form a plurality of "T" shapes or a part thereof. For example, each of the first sub-finger regions SF11 and each of the first sub-strap regions SS11 may be connected to each other to form a "T" shape or a part thereof, and each of the second sub-finger regions SF12 and each of the second sub-strap regions SS12 may be connected to each other to form a "T" shape or a part thereof. However, the present inventive concept is not limited thereto. For example, the first color pattern CL11, the second color pattern CL12, the third color pattern CL13, and the fourth color pattern CL14 may form, for example, a plurality of "L" shapes or a part thereof, respectively.

In an exemplary embodiment, the first color pattern CL11 and the second color pattern CL12 overlap each other, and the third color pattern CL13 and the fourth color pattern CL14 overlap each other. For example, as illustrated in FIG. 11, a part of the first color pattern CL11 and a part of the second color pattern CL12 may overlap to form a first stitch region ST11, and a part of the third color pattern CL13 and a part of the fourth color pattern CL14 may overlap to form a second stitch region ST12.

As illustrated in the drawings, the first stitch region ST11 may overlap the third sub-finger region SF13 or the fourth sub-finger region SF14 in the second direction Y. For example, when the first color pattern CL11 and the second color pattern CL12 have a "T" shape or a part thereof, the first stitch region ST11 may overlap the third sub-finger region SF13 or the fourth sub-finger region SF14 in the second direction Y. The first stitch region ST11 may extend in the second direction Y.

However, the present inventive concept is not limited thereto since the first stitch region ST11 may overlap the first sub-finger region SF11 or the second sub-finger region SF12 in the second direction Y. For example, when the first color pattern CL11 and the second color pattern CL12 have an "L" shape or a part thereof, the first stitch region ST11 may overlap the first sub-finger region SF11 or the second sub-finger region SF12 in the second direction Y.

In an exemplary embodiment, the second stitch region ST12 overlaps the first sub-finger region SF11 or the second sub-finger region SF12 in the second direction Y. For example, when the third color pattern CL13 and the fourth color pattern CL14 have a "T" shape or a part thereof, the second stitch region ST12 may overlap the first sub-finger region SF11 or the second sub-finger region SF12 in the second direction Y. The second stitch region ST12 may extend in the second direction Y.

Unlike the illustrated configuration, in an exemplary embodiment of the inventive concept, one of the first layout pattern LY1 or the second layout pattern LY2 are not separated. For example, in one embodiment, the first layout pattern LY1 is separated to generate a first color pattern CL11 and a second color pattern CL12, but the second layout pattern LY2 is not separated. Conversely, in another embodiment, the second layout pattern LY2 is separated to generate the third color pattern CL13 and the fourth color pattern CL14, but the first layout pattern LY1 is not separated.

With the high integration of semiconductor devices, the line widths of patterns included in the semiconductor devices are further miniaturized. Multi-patterning processes using a plurality of color patterns may be utilized to form a pattern of miniaturized line widths. However, in the miniaturized line widths, imbalance in color patterns may degrade the reliability of semiconductor devices.

If the first layout pattern LY1 and the second layout pattern LY2 are not separated, the patterning process needs to be performed twice with two color patterns to fabricate a capacitor. However, if the process for fabricating the semiconductor device including the capacitor and elements other than the capacitor uses three or more color patterns, in the region in which the capacitor using only the two color patterns is fabricated, imbalance in color patterns may be caused. The imbalance in color patterns may degrade the reliability of the semiconductor device including the capacitor.

However, when the layout design method of the semiconductor device according to an exemplary embodiment of the inventive concept utilizes three or more color patterns, it is possible to improve the imbalance in color patterns in the region in which the above capacitor is fabricated. In an embodiment, the colors of the first through fourth color patterns CL11-CL14 are different from one another. In another embodiment, the colors of three of the four color patterns CL11-CL14 are different from one another and the remaining color pattern is the same as one of the three color patterns.

Further, as illustrated in FIGS. 11 to 14, the layout design method of the semiconductor device according to an exemplary embodiment of the inventive concept provides three or more symmetric color patterns. Thus, the imbalance in color pattern, for example, in the region in which the capacitor is fabricated may be further improved. Therefore, a semiconductor device with improved product reliability can be provided.

Figure 13:
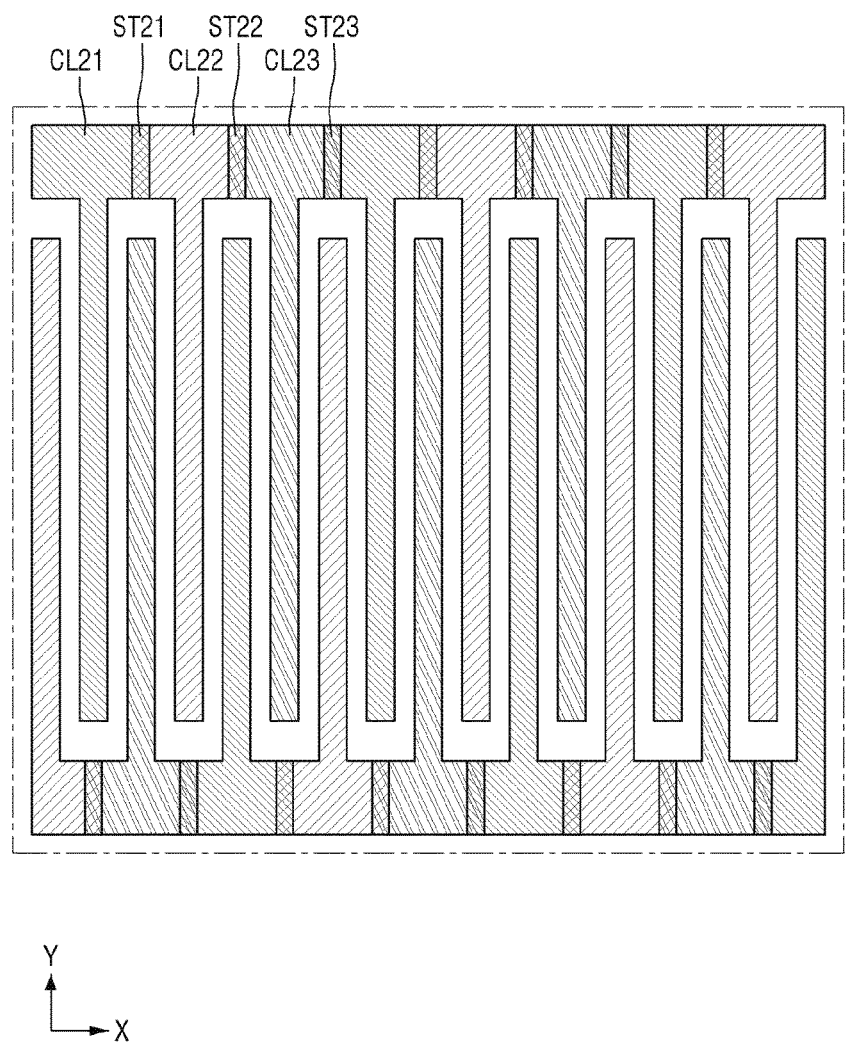
FIGS. 13 and 14 are layout diagrams for explaining the layout design method of the semiconductor device according to an exemplary embodiment of the present inventive concept.
Figure 14:
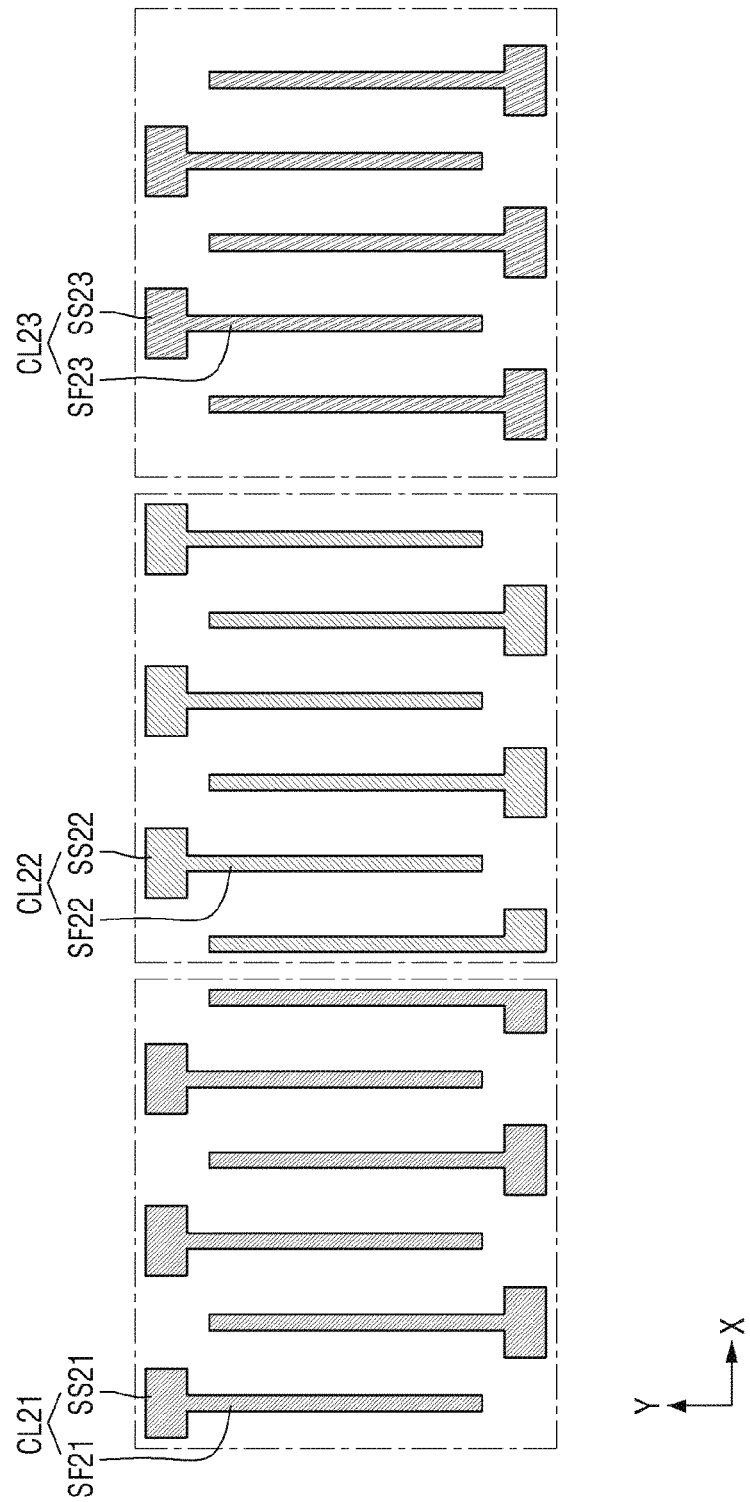

FIGS. 13 and 14 are layout diagrams for explaining the layout design method of the semiconductor device according to an exemplary embodiment of the present inventive concept. For the sake of convenience of explanation, repeated parts of those described with reference to FIGS. 10 to 12 will be briefly described or omitted.

For reference, FIG. 14 is a layout diagram separately illustrating each of the color patterns of FIG. 13.

Referring to FIGS. 10, 13, and 14, the first layout pattern LY1 and the second layout pattern LY2 are separated to generate a fifth color pattern CL21, a sixth color pattern CL22, and a seventh color pattern CL23. In an embodiment, the colors of the fifth through seven color patterns CL21-CL23 are different from one another.

The fifth color pattern CL21 may include a plurality of fifth sub-finger regions SF21 and a plurality of fifth sub-strap regions SS21. Each of the fifth sub-finger regions SF21 of the fifth color pattern CL21 may be one of a plurality of first finger regions (220R of FIG. 10) or a plurality of second finger regions (320R of FIG. 10). Each fifth sub-strap region SS21 of the fifth color pattern CL21 may be a part of the first strap region (210R of FIG. 10) or a part of the second strap region (310R of FIG. 10) connected to each of the fifth sub-finger region SF21.

The sixth color pattern CL22 may include a plurality of sixth sub-finger regions SF22 and a plurality of sixth sub-strap regions SS22. Each of the sixth sub-finger regions SF22 of the sixth color pattern CL22 may be a first finger region (220R of FIG. 10) or a second finger region (320R of FIG. 10) adjacent to each of the fifth sub-finger regions SF21. Each of the sixth sub-strap regions SS22 of the sixth color pattern CL22 may be a part of the first strap region (210R of FIG. 10) or a second strap region (310R of FIG. 10) connected to each of the sixth sub-finger regions SF22.

The seventh color pattern CL23 may include a plurality of seventh sub-finger regions SF23 and a plurality of seventh sub-strap regions SS23. Each seventh sub-finger region SF23 of the seventh color pattern CL23 may be a first finger region (220R of FIG. 10) or a second finger region (320R of FIG. 10) adjacent to each of the sixth sub-finger regions SF22. Each of the sixth sub-strap regions SS22 of the sixth color pattern CL22 may be a part of the first strap region (210R of FIG. 10) or a part of the second strap region (310R of FIG. 10) connected to each of the sixth sub-finger regions SF22.

The fifth color pattern CL21, the sixth color pattern CL22, and the seventh color pattern CL23 may be alternately arranged. For example, as illustrated in FIG. 13, the fifth color pattern CL21, the sixth color pattern CL22, and the seventh color pattern CL23 may be arranged alternately along the first direction X.

In an embodiment, the fifth color pattern CL21, the sixth color pattern CL22 and the seventh color pattern CL23 overlap each other. For example, as illustrated in FIG. 13, a part of the fifth color pattern CL21 and a part of the sixth color pattern CL22 overlap each other to form a third stitch region ST21, and a part of the sixth color pattern CL22 and a part of the seventh color pattern CL23 overlap each other to form a fourth stitch region ST22. Further in the embodiment, a part of the fifth color pattern CL21 and a part of the seventh color pattern CL23 overlap each other to form the fifth stitch region ST23.

Hereinafter, a method for fabricating a semiconductor device according to an exemplary embodiment of the present inventive concept will be described with reference to FIGS. 1 to 5, 10 to 14, and 15.

Figure 15:
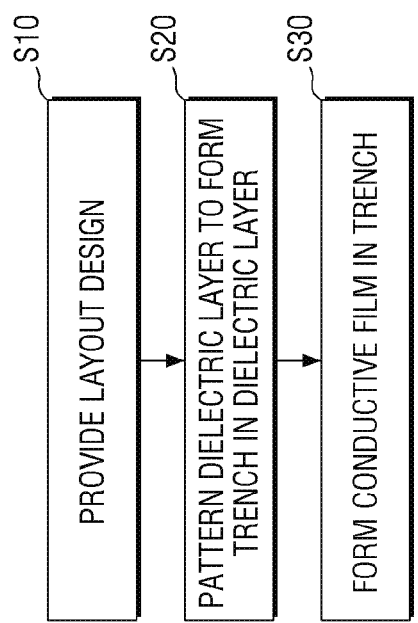
FIG. 15 is a flowchart for explaining a method for fabricating the semiconductor device according to an exemplary embodiment of the present inventive concept.

FIG. 15 is a flowchart for explaining a method for fabricating the semiconductor device according to an exemplary embodiment of the present inventive concept. For the sake of convenience of explanation, repeated parts of those described with reference to FIGS. 1 to 5 will be briefly explained or omitted.

Referring to FIG. 15, first, a layout design is provided (S10). For example, a circuit layout may be loaded from a file.

The layout design is to design a mask pattern used for manufacturing a circuit designed, for example, by a semiconductor circuit design technician or engineer on a wafer. In an exemplary embodiment, the circuit includes a capacitor.

The layout design may be manually created by a full customer layout method in which the design technicians or engineers design elements such as transistors, resistors, and capacitors used in the design circuit and connect the wires.

Alternatively, the layout design may be automatically formed by a computing system which uses a circuit-based layout tool (e.g., schematic driven layout tools) in which the cells of the logic elements provided in the process are automatically arranged at desired positions on the basis of the designed circuit information and the wirings are connected or auto place and routing tools (Auto P & P tools) may be used.

The layout design created by the full customer layout method, the circuit-based layout tool or Auto P & R tool may have a polygonal shape. For example, the layout diagram of FIG. 11 or FIG. 13 may be used to fabricate (e.g., manufacture) a semiconductor device according to an exemplary embodiments of the inventive concept.

Subsequently, a dielectric layer is patterned using the layout design (S20). As a result, a trench is formed in the dielectric layer.

For example, the dielectric layer 110 of FIG. 1 may be patterned, using the layout design. Patterning the dielectric layer 110 may be performed, for example, by a photolithography process.

For example, when patterning the dielectric layer 110 using the layout diagram of FIG. 11, four photolithography processes may be performed with the four mask patterns, using the first to fourth color patterns (CL11 to CL14). Alternatively, for example, when patterning the dielectric layer 110 using the layout diagram of FIG. 13, three photolithography processes may be performed with three mask patterns, using the fifth to seventh color patterns (CL21 to CL23).

Therefore, the first trench TR1, the second trench TR2, the third trench TR3 and the fourth trench TR4 may be formed in the dielectric layer 110.

Next, a conductive film is formed in the trench (S30).

For example, a conductive film may be formed in the dielectric layer 110 of FIG. 1 including the first trench TR1, the second trench TR2, the third trench TR3, and the fourth trench TR4. Therefore, the first electrode 200 including the first strap 210 filling the first trench TR1, and the first finger 220 filling the second trench TR2 may be formed. Also, the second electrode 300 including the second strap 310 filling the third trench TR3 and the second finger 320 filling the fourth trench TR4 may be formed.

Those skilled in the art will appreciate that many variations and modifications can be made to the exemplary embodiments without substantially departing from the principles of the present inventive concept.

What is claimed is:

1. A semiconductor device comprising:
a first electrode including a first main portion, and a first extension that extends from the first main portion; and
a dielectric layer which surrounds a sidewall and a bottom surface of the first main portion,
wherein the first main portion includes a first portion having a first depth, and a second portion having a second depth deeper than the first depth.

2. The semiconductor device of claim 1, wherein the first extension has a third depth shallower than the second depth.

3. The semiconductor device of claim 2, the first depth and the third depth are substantially the same.

4. The semiconductor device of claim 1, further comprising:
a second electrode including a second main portion and a second extension that extends from the second main portion,
wherein the dielectric layer electrically insulates the first electrode from the second electrode.

5. The semiconductor device of claim 4, wherein the dielectric layer further surrounds the sidewall and the bottom surface of the second main portion, and
the second main portion includes a third portion having a third depth, and a fourth portion having a fourth depth deeper than the third depth.

6. The semiconductor device of claim 5, wherein the second depth is substantially the same as the fourth depth.

7. The semiconductor device of claim 4, wherein the first main portion and the second main portion extend in a first direction, and
the first extension and the second extension extend in a second direction intersecting with the first direction.

8. The semiconductor device of claim 7, wherein the second portion of the first main portion extends in the second direction.

9. The semiconductor device of claim 7, wherein the second portion of the first main portion overlaps the second extension in the second direction.

10. The semiconductor device of claim 1, wherein the first main portion further includes a third portion having a third depth, and
the third depth is different from the first depth and is shallower than the second depth.

11. A semiconductor device comprising:
a first electrode including a first main portion extending in a first direction, and a first extension extending from the first main portion in a second direction intersecting with the first direction;
a second electrode including a second extension extending in the second direction; and
a dielectric layer surrounding a sidewall and a bottom surface of the first main portion,
wherein the first main portion includes a first portion having a first depth, and
the second extension has a second depth shallower than the first depth.

12. The semiconductor device of claim 11, wherein the first main portion further includes a second portion having a third depth shallower than the first depth.

13. The semiconductor device of claim 12, wherein the first portion and the second portion of the first main portion are alternately arranged along the first direction.

14. The semiconductor device of claim 12, wherein the second depth and the third depth are substantially the same.

15. The semiconductor device of claim 11, wherein the first portion of the first main portion overlaps the second extension in the second direction.

16. The semiconductor device of claim 11, wherein the first portion of the first main portion overlaps the first extension in the second direction.

17. A semiconductor device comprising:
a first electrode including a first main portion extending in a first direction, and a plurality of first extensions extending from the first main portion in a second direction intersecting with the first direction;
a second electrode including a plurality of second extensions extending in the second direction; and
a dielectric layer disposed between each of the first extensions and each of the second extensions,
wherein each of the first extensions and each of the second extensions are arranged alternately along the first direction,
the first main portion includes a plurality of first portions having a first depth, and a plurality of second portions having a second depth deeper than the first depth, and each of the second portions of the first main portion overlaps each of the second extensions in the second direction.

18. The semiconductor device of claim 17, wherein each of the first portions of the first main portion overlaps each of the first extensions in the second direction.

19. The semiconductor device of claim 17, wherein each of the first portions of the first main portion and each of the second portions of the first main portion are alternately arranged along the first direction.

20. The semiconductor device of claim 17, wherein each of the second portions of the first main portion extends in the second direction.

* * * * *